United States Patent
Hardee

(10) Patent No.: US 6,300,810 B1
(45) Date of Patent: Oct. 9, 2001

(54) VOLTAGE DOWN CONVERTER WITH SWITCHED HYSTERESIS

(75) Inventor: Kim C. Hardee, Colorado Springs, CO (US)

(73) Assignee: United Microelectronics, Corp., San Francisco, CA (US)

( * ) Notice: Subject to any disclaimer, the term of this patent is extended or adjusted under 35 U.S.C. 154(b) by 0 days.

(21) Appl. No.: 09/492,727

(22) Filed: Jan. 27, 2000

Related U.S. Application Data

(60) Provisional application No. 60/118,736, filed on Feb. 5, 1999.

(51) Int. Cl.[7] .................................................. H03K 3/356
(52) U.S. Cl. .......................... 327/206; 327/536; 327/540
(58) Field of Search .................................. 323/282, 283; 327/60, 72, 73, 77, 205, 206, 534, 535, 536, 537, 538, 540, 541, 543, 545, 546

(56) References Cited

U.S. PATENT DOCUMENTS

| | | | |
|---|---|---|---|
| 5,334,890 | 8/1994 | Hardee | 307/530 |
| 5,574,681 | 11/1996 | Foss et al. | 365/149 |
| 5,598,122 | 1/1997 | McClure | 327/538 |
| 5,614,856 | 3/1997 | Wilson et al. | 327/170 |
| 5,666,074 | 9/1997 | Chun | 327/51 |
| 6,025,707 | * 2/2000 | Joo | 323/283 |
| 6,127,882 | * 10/2000 | Vargha et al. | 327/540 |
| 6,133,779 | * 10/2000 | Sichert et al. | 327/540 |
| 6,163,190 | * 12/2000 | Takai et al. | 327/205 |

OTHER PUBLICATIONS

Changhyun, Kim, "Basic Dram Operation", Feb. 1998, Samsung Electronics.

* cited by examiner

*Primary Examiner*—Jeffrey Zweizig
(74) *Attorney, Agent, or Firm*—Stuart T. Langley; William J. Kubida; Hogan & Hartson LLP

(57) ABSTRACT

A voltage down converter with hysteresis generator combining a hysteresis signal to a reference voltage and an output voltage feedback signal applied to a comparator. The hysteresis generator is coupled to a control signal giving advance notice of when a high current load is to be activated. The hysteresis signal is switched to a first state prior to the high current load activation, and switched to a second state after the high current load activation. In the first state, the hysteresis voltage is added to a reference voltage. In the second state, the hysteresis voltage is added to the voltage output feedback signal.

8 Claims, 4 Drawing Sheets

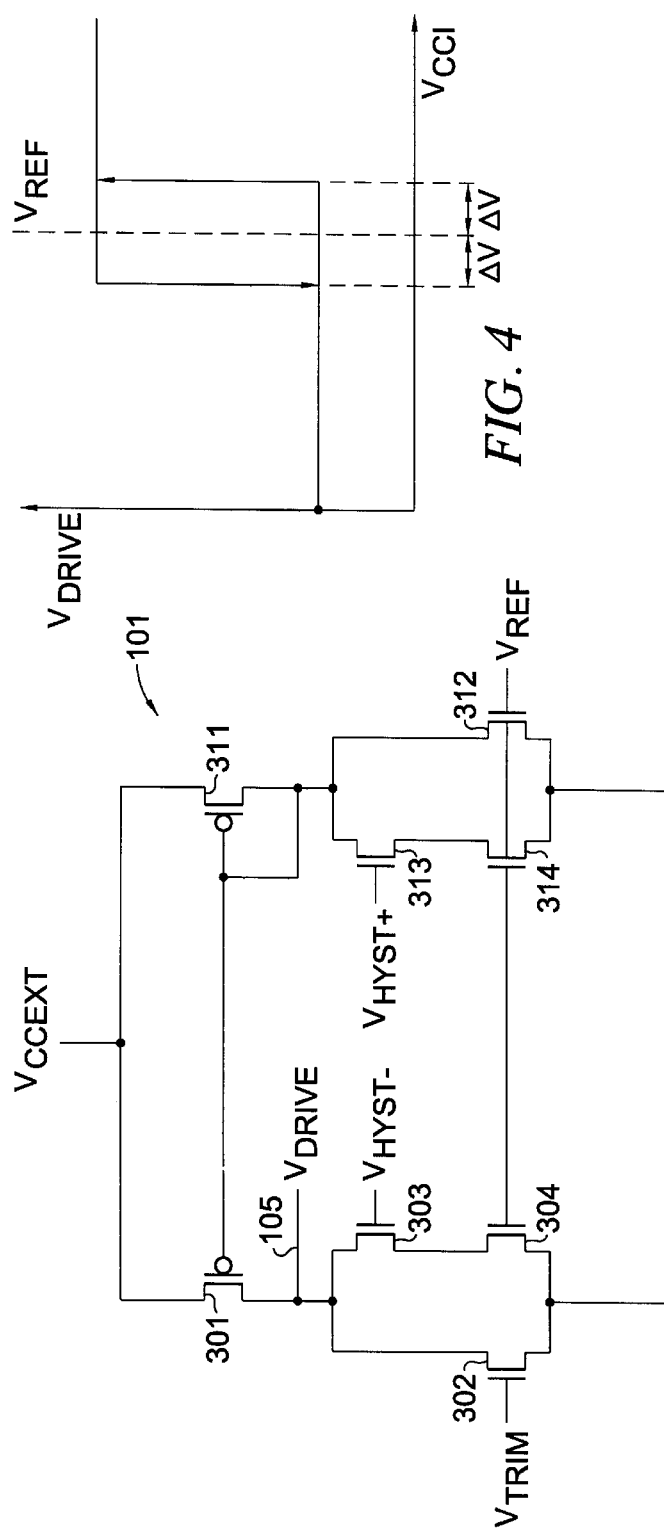
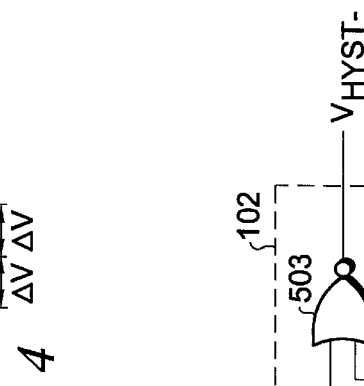
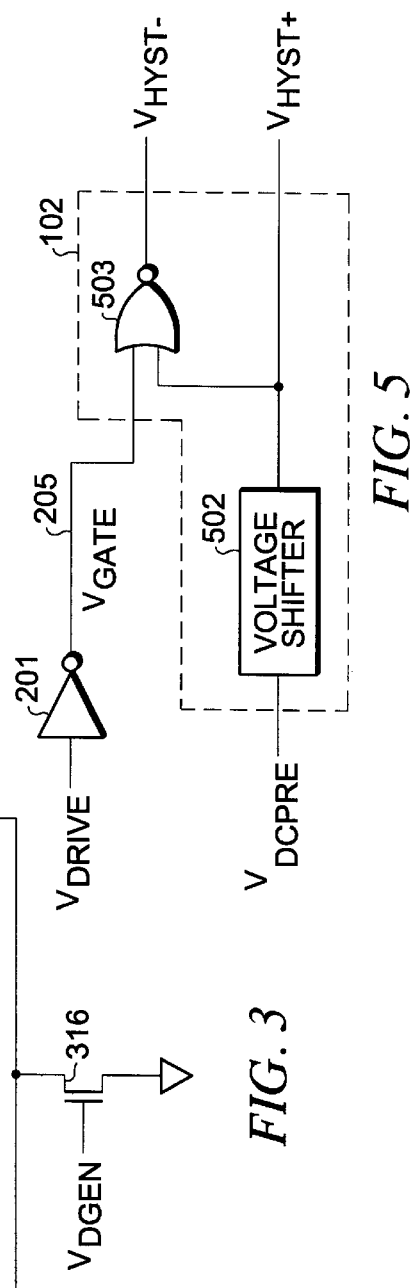
FIG. 4
FIG. 5
FIG. 3

VOLTAGE DOWN CONVERTER WITH SWITCHED HYSTERESIS

This application claims benefit of provisional application No. 60/118,736, filed Feb. 5, 1999.

BACKGROUND OF THE INVENTION

1. Field of the Invention

The present invention relates, in general, to integrated circuits and, more particularly, to integrated circuits having voltage regulator circuits generating an internal power supply voltage from an external power supply voltage.

2. Relevant Background

Integrated circuits (ICs) comprise thousands or millions of individual devices interconnected to provide desired functionality. Significant effort is expended to improve processing techniques so as to reduce the size of each individual device in order to provide greater functionality on a given IC chip at reduced cost. In general, smaller geometry devices operate faster while dissipating less power than do larger geometry devices. As device geometries are reduced the breakdown voltages of the devices and the isolation that separates the devices decreases also.

Electronic systems usually comprise ICs manufactured with a variety of technologies. This has created a need for multiple power supply voltages to be supplied to a single printed circuit board to support the various types of devices on that board. For example, devices are available that require a power supply voltages ranging from 5.0 volts to 2.5 volts. A practical solution to this disparity is to provide voltage down converter circuitry that decreases the higher voltage (e.g., 5.0V in the above example) to the lower voltage required internally by the small geometry device (e.g., 3.3 V or 2.5V). Hence, it is necessary to regulate the available external power supply voltage to provide voltages consistent with that required internally by each of the small geometry ICs.

To limit undesirable volt age droop on the internal voltage supply node during high current loads, a large capacitor is coupled between the internal voltage supply nod e and ground. In practice, however, filter capacitors consume a great deal of area without adding functionality. Cost and circuit size considerations dictate limiting the filter capacitor to more modest sizes. Hence, it is desirable to minimize voltage ripple in ways that do not require large filter capacitors.

A conventional voltage down converter (also called regulators and DC/DC converters) is designed to generate a lower voltage than the available supply voltage In a linear regulator, a transistor is coupled in series between the external voltage supply node and the internal voltage supply node. The conductivity of the transistor is modulated to drop the excess voltage across the transistor. Linear regulators have many desirable characteristics such as simplicity, low output ripple, high quality line and load regulation, and fast recovery time. However, linear regulators are inefficient resulting in wasted power and excess heat generation.

Pulse width modulation (PWM) regulators are becoming more common because of their higher efficiency. A PWM down converter compares the voltage on the internal voltage supply node to a reference voltage to generate a PWM signal that is on (i.e., a logic high) when the internal supply voltage is too low, and off (i.e., a logic low) when the internal supply voltage is too high. The PWM signal controls the transistor coupled in series between the external voltage node and the internal voltage supply node. The series transistor operates primarily in either the on or off state where power losses are smallest (as compared to the linear region where power loss is greater).

The comparator used in conventional PWM regulators to compare the reference voltage to the internal supply voltage has a time delay before its outputs react to a change in the internal supply voltage. This delay is manifested as drooping and overshoot in the internal supply voltage, particularly under high current loads. In a memory device, for example, thousands of sense amplifiers are activated simultaneously creating periodic high current loads. This is complicated in light of a trend towards smaller transistors in the voltage down converter as well as smaller filter capacitors. Moreover, as more memory cells are placed on a single integrated circuit the interconnect lines become smaller, more resistive, and greater in number all of which lead to greater demand on the circuitry generating the internal supply voltage.

A technique used to minimize voltage droop in external (i.e., off-chip) down converters employs a hysteretic comparator to compare the converter output voltage to a reference voltage. However, it is difficult to generate accurate hysteresis using off-chip components that do not have direct access to the internal voltage supply levels that must be regulated. Although this limitation can be overcome by bringing the internal supply voltage out to a pin of the IC, this solution degrades the system's noise performance as well as raises the cost to manufacture the device. Moreover, the load capacitance created by the pins is significant making the design more complex in addition to degrading the overall performance device. A need exists for a voltage down converter that can be implemented on-chip with improved resistance to droop and overshoot in high load applications.

SUMMARY OF THE INVENTION

The present invention involves a voltage down converter with hysteresis generator combining a hysteresis signal to a reference voltage and an output voltage feedback signal applied to a comparator. The hysteresis generator is coupled to a control signal giving advance notice of when a high current load is to be activated. The hysteresis signal is switched to a first state prior to the high current load activation, and switched to a second state prior to the high current load being deactivated. In the first state, the hysteresis voltage is added to a reference voltage. In the second state, the hysteresis voltage is added to the voltage output feedback signal.

The present invention involves a voltage down converter including an input node receiving an external voltage and a driver unit selectively coupling the input node to an internal voltage supply node in response to a drive control signal. A hysteresis timing unit responsive to an external control signal generates a first control signal VHYST− and a second control signal VHYST+. A comparator unit is coupled to the internal voltage supply node, VREF, VHYST− and VHYST+ and coupled to the driver unit to generate the drive control signal. The comparator unit has a first mode, a second mode, and a third mode selected by the VHYST− and VHYST+ signals.

BRIEF DESCRIPTION OF THE DRAWINGS

FIG. 3 illustrates a second portion of the down converter shown in FIG. 1 in greater detail;

FIG. 4 shows a voltage diagram illustrating switching behavior of a hysteretic comparator in accordance with the present invention;

FIG. 5 illustrates a third portion of the down converter shown in FIG. 1 in greater detail;

DETAILED DESCRIPTION OF THE PREFERRED EMBODIMENTS

Figure 1:
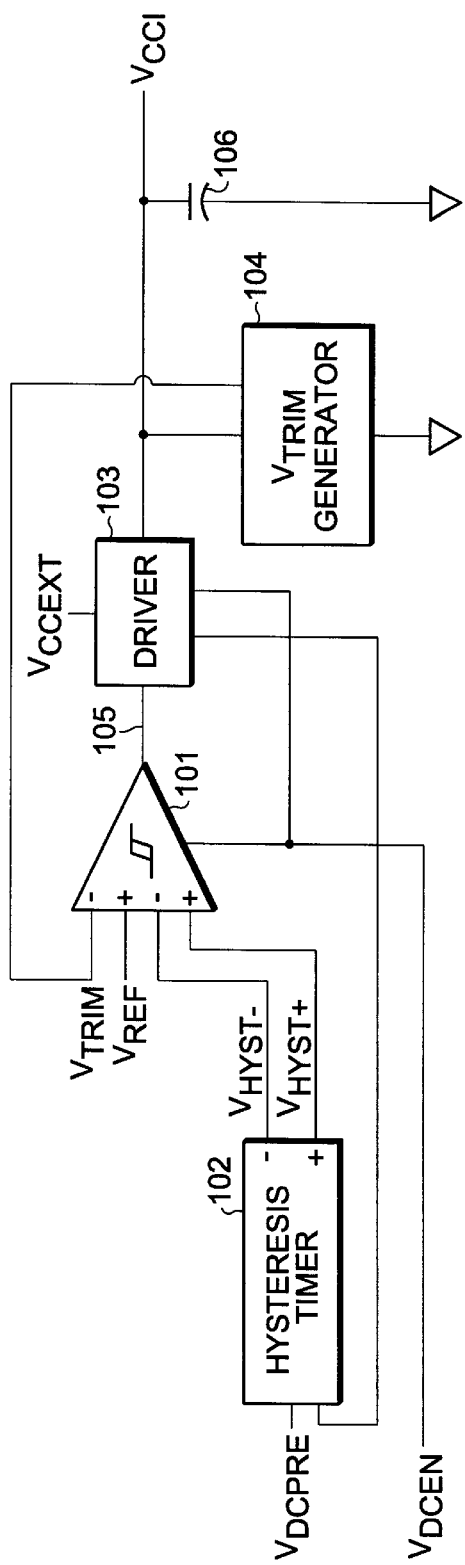
FIG. 1 illustrates in block diagram form a voltage down converter in accordance with the present invention.

The voltage down converter in accordance with the present invention is illustrated in block diagram form in FIG. 1. It should be understood that the implementations shown in FIG. 1–FIG. 5 are provided for example only and that the present invention may be implemented in other technologies including bipolar and BICMOS technologies, and may use circuits having a greater or lesser number of components to realize the functionality described herein. Accordingly, these other implementations are equivalent to the specific implementations described herein.

A four-input hysteretic comparator 101 produces a control signal on line 105 that is coupled to a driver unit 103. Driver unit 103 supplies current from the external power supply voltage $V_{CCEXT}$ in response to the control signal to charge filter capacitor 106. To conserve power, the major power consuming components of the down converter are desirably selectively enabled by the VDCEN control signal.

The output voltage VCCI is controlled by comparing a reference voltage (VREF) to VTRIM. VREF is generated in a conventional manner using voltage generating components such as a band gap reference circuit that provides a suitably stable reference voltage. VTRIM is derived from VCCI by VTRIM generator 104. Conveniently, VTRIM is set to one half VCCI, although any value may be selected. VTRIM generator 104 may comprise a simple voltage divider circuit, for example.

Ignoring the effects of hysteresis timer 102 for the moment, in a particular example the output of comparator 101 (i.e., line 105 in FIG. 2) goes high when VTRIM is below VREF to activate driver 103. Similarly, the output of comparator 101 goes low to turn off driver 103 when VTRIM is greater than VREF. Driver 103 comprises a conventional switch component such as a bipolar or MOS transistor that supplies charge when on to filter capacitor 106 from VCCEXT to generate the internal voltage VCCI.

Comparator 101 includes a VHYST− and a VHYST+ control signals that indicate when a hysteresis voltage is to be added or subtracted by comparator 101. When the VHYST− signal is active, a hysteresis voltage is effectively added to VTRIM thereby causing comparator 101 to turn off when VCCI rises to slightly below the target VCCI. Similarly, when the VHYST+ signal is active, a hysteresis voltage is effectively added to VREF thereby causing comparator 101 turn on when VCCI falls to slightly above the VCCI target. Hysteresis timer unit 102 generates VHYST− and VHYST+ control signals using an externally generated timing signal such as VDCPRE shown in FIG. 1. Although VDCPRE is referred to as externally generated, this means that it is generated externally to comparator 101—it should be understood that VDCPRE is preferably generated by control circuitry on the same IC as comparator 101. In a particular implementation, VDCPRE is a control signal in a memory device that goes high prior to sensing and then goes low shortly after sensing has begun. Other control signals may be useful to generate VHYST− and VHYST+ and such control signals are equivalent to the specific example provided herein.

Figure 2:
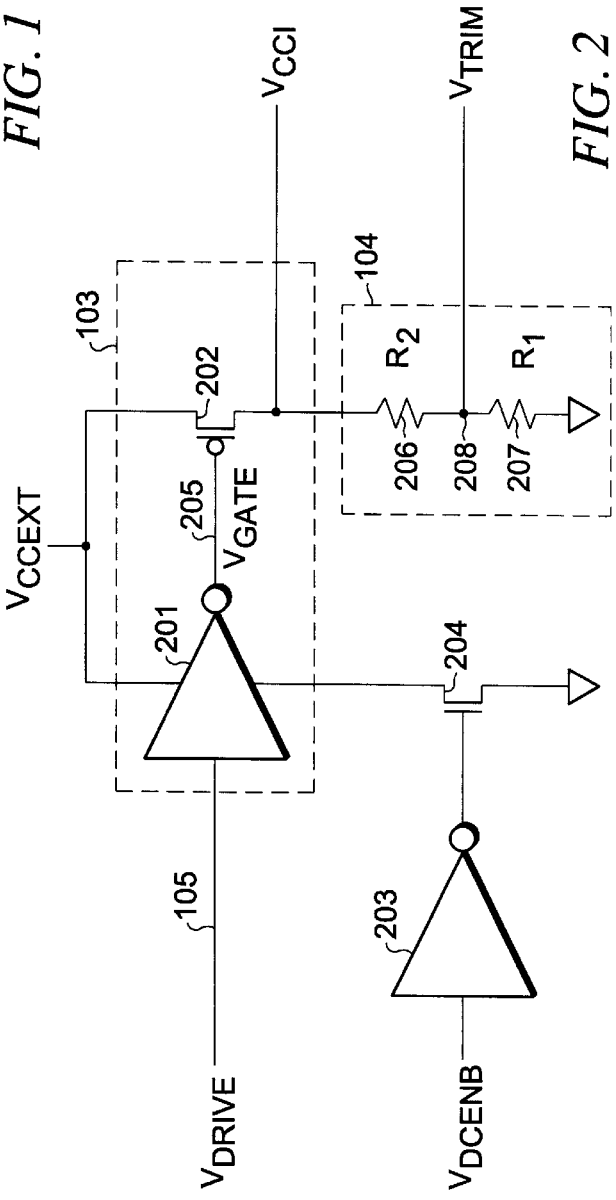
FIG. 2 illustrates a first portion of the down converter shown in FIG. 1 in greater detail.

FIG. 2 illustrates an exemplary circuit implementing driver 103 and VTRIM generator 104 shown in FIG. 1. Node 105 is coupled through an inverter 201 to the control input of switch 202. Switch 202 is a p-channel MOSFET having a first current carrying node coupled to VCCEXT and a second current carrying node coupled to provide VCCI. In this manner, when the signal on node 105 is logic high, the output of inverter 201 is low, and FET 202 is turned on. The voltage across R 207 in FIG. 2 determines VTRIM from VCCI. The values of R1 resistor 206 and R2 resistor 207 are selected to provide the desired voltage and to enable sufficient current flow such that node 208 is not loaded by the input circuitry of comparator 101. Inverter 203 receives the enable bar (VDCENB) signal and generates a non-inverted enable (VDCEN) signal that controls transistor 204. In this manner, inverter 201 can be disabled by appropriate application of the VDCENB signal.

FIG. 3 schematically illustrates a particular CMOS implementation of comparator 101 shown in FIG. 1. Comparator 101 is configured essentially as an extended differential comparator. On the left side, load transistor 301 and input transistor 302 form a first current leg. On the right side, load transistor 311 and input transistor 312 form a second current leg. The first current leg is responsive to VTRIM while the second current leg is responsive to VREF. Transistors 302 and 312 are matched as are load transistors 301 and 311. Transistor 316 is responsive to the VDCEN signal to decouple comparator 101 from ground during standby mode to reduce power consumption.

Coupled in parallel with input transistor 302 is a series combination of transistors 303 and 304. Transistor 303 is controlled by the VHYST− signal. Transistor 304 is coupled to the VREF signal and so will conduct a constant current whenever VHYST− and VDCEN are on. Hence, when VHYST− is on, the differential comparator is imbalanced and behaves as if VTRIM were higher than it actually is. As a result, the output at node 105 will switch from low to high whwn VTRIM is slightly (e.g., 0.2 volts in a particular example) below VREF. In operation, VHYST− is active when an overshoot is expected such as when sense amplifiers in a memory circuit are being turned off. In this manner, when an overshoot condition occurs or is expected, driver 103 begins to turn off at a VCCI level lower than the target level so that it is substantially off when VCCI reaches the target level. In this manner, VCCI does not rise above acceptable levels.

Coupled in parallel with input transistor 312 is a series combination of transistors 313 and 314. Transistor 313 is controlled by the VHYST+ signal. Transistor 314 is coupled to the VREF signal and so will conduct current whenever VHYST+ and VDCEN are on. Hence, when VHYST+ is on, the differential comparator is imbalanced and behaves as if VREF were higher than it actually is. As a result, the output at node 105 will not switch from high to low until VTRIM is slightly (e.g., 0.2 volts in a particular example) above VREF. In operation, VHYST+ is active when a droop is expected such as when sense amplifiers in a memory circuit are being turned on. In this manner, when an high load condition occurs or is expected, driver 103 turns on at a higher VCCI level than the target level to couple charge to filter capacitor 106 so that filter capacitor 106 can supply the high load current without allowing VCCI to fall below acceptable levels.

The voltage at which the output of comparator 100 switches is referred to as the "trip-point". The trip-point is centered at VREF as shown in FIG. 4. The hysteresis voltage (indicated by ΔV in FIG. 4) is selected by the size of transistors 304 and 314 which is determined when comparator 101 is designed to meet the needs of a particular application. Wider transistors result in a larger hysteresis voltage. In the particular example both transistor 304 and 314 are similarly sized to provide symmetric hysteresis. However, the transistors can have different sizes to provide asymmetric hysteresis if desired. Alternatively, transistor 304 can be implemented by a plurality of parallel coupled transistors that can be individually programmably coupled to the VREF signal by, for example, mask programmable or field programmable techniques. This latter technique allows the hysteresis voltage to be programmed. The benefits of the present invention are greatly exploited in hysteretic DC-DC converters where the accuracy and speed of the comparator are important.

FIG. 5 shows a specific CMOS implementation of hysteresis timing unit 102 in accordance with the present invention. In the particular example, VHYST+ is derived directly from the VDCPRE signal described hereinbefore. In the preferred implementation, VDCPRE is an internal control signal that operates on VCCI voltage levels. To ensure that transistor 313 shown in FIG. 1 is turned on fully, it is desirable to shift the VDCPRE signal to a logic level driven from VCCEXT. Any available voltage shift technique may be used to implement voltage shift unit 502. Care should be exercised in implementing voltage shift unit 502 to ensure that any delays associated with voltage shift unit 502 are acceptable (i.e., allow VHYST+ to react quickly enough to turn on transistor 313 when VDCPRE indicates that a high current load is being activated).

Likewise, NOR gate 503 should be driven from VCCEXT to ensure full turn on of transistor 303 shown in FIG. 3. The signal on node 105 is logically combined with the voltage translated output of voltage shift unit 502 by NOR gate 503 to generate the VHYST− signal. Again, care should be taken to ensure that any delays associated with NOR gate 502 provide acceptable timing margin for the turn on of transistor 303 when VDCPRE indicates that a high current load is being turned off.

Figure 6:
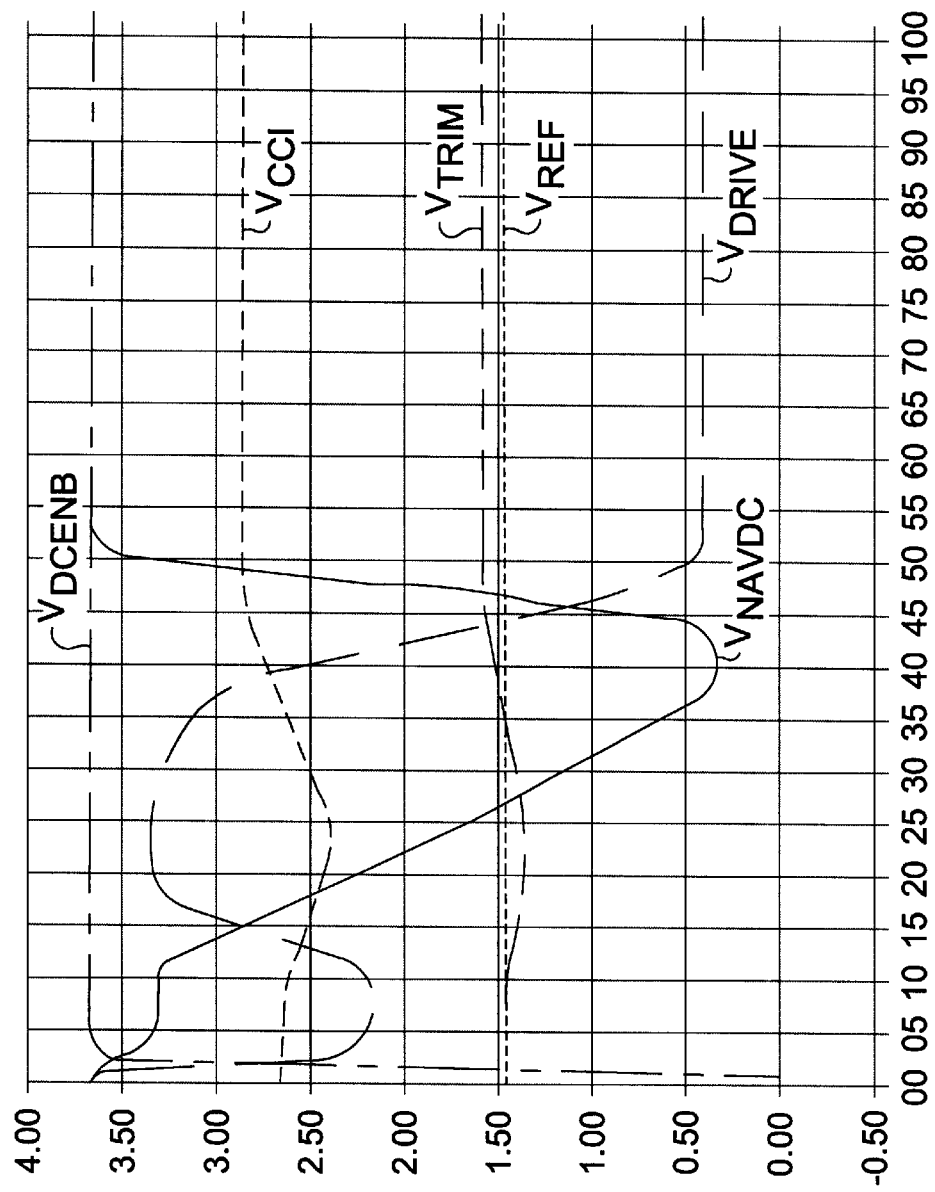
FIG. 6 waveforms describing the operation of a prior art voltage down converter.
Figure 7:
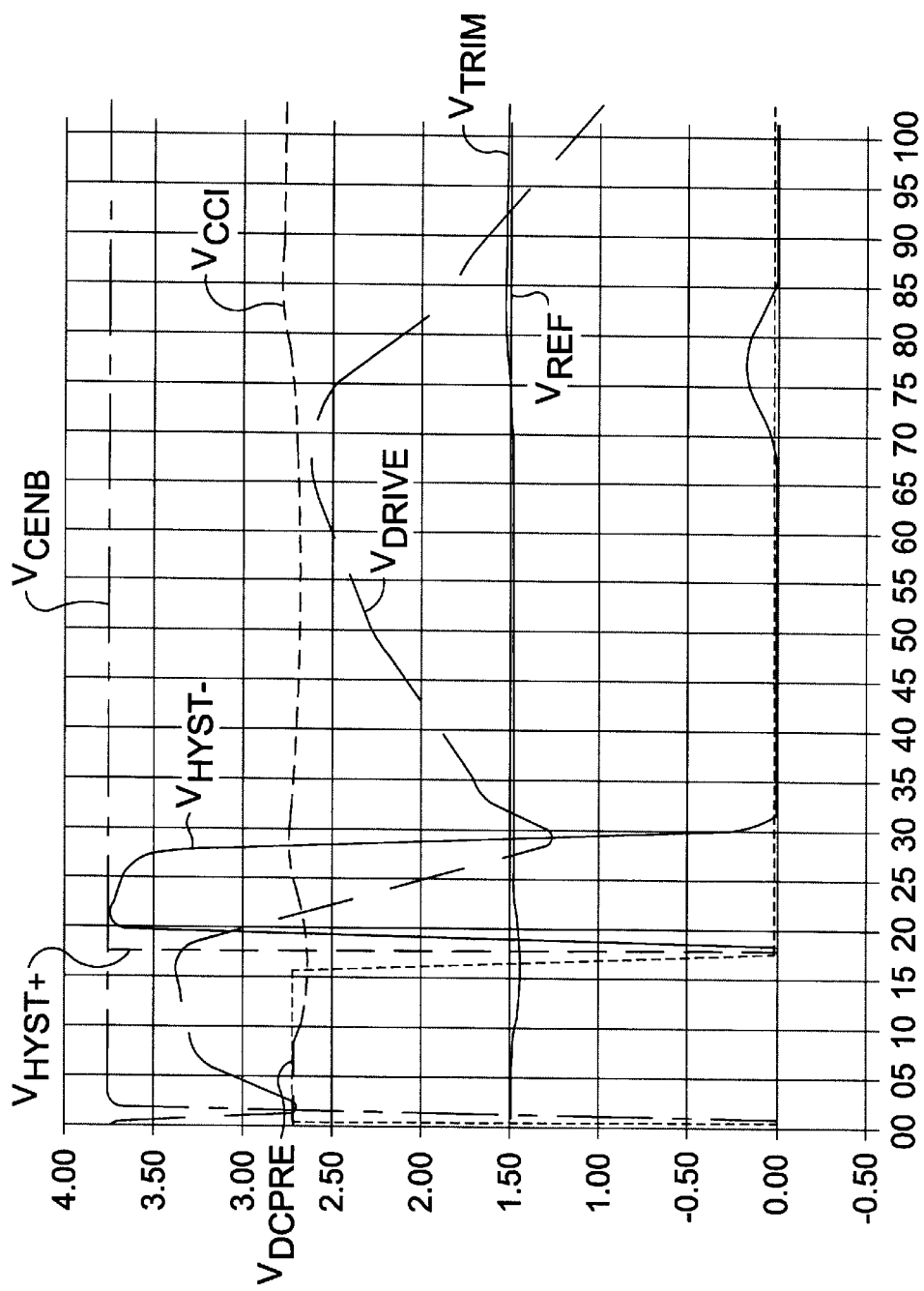
FIG. 7 waveforms describing the operation of a voltage down converter in accordance with the present invention.

FIG. 6 (prior art) and FIG. 7 show waveforms illustrating the improved performance of the voltage down converter in accordance with the present invention. Just after time 00 comparator 101 is enabled by the VDCENB signal. Because VTRIM is slightly greater than VREF at this time, VDRIVE falls to prevent driver 103 from turning on. At about time 10 a high current load is activated and VCCI begins to drop along with VTRIM that follows VCCI. When VTRIM falls below VREF the VDRIVE signal turns on. However, by the time driver 103 is turned on, VCCI has already experienced significant droop which is worst during from about time 15 to about time 30. Driver 103 continues to supply charge to filter capacitor 106 until VTRIM rises above VREF at about time 40. However, by time 40 VCCI has already experienced an overshoot because the high current load was turned off. Once the load is off, VCCI can remain in an overvoltage state for some time because little load current is required and so filter capacitor 106 remains charged.

In contrast, FIG. 7 shows a similar high load switching situation handled by the voltage down converter in accordance with the present invention. In this case, the high current load turn on is anticipated by the VDCPRE signal which goes high just after time 00. VHYST+ goes high simultaneously to the VCCEXT level while VHYST− remains low. After VHYST+ goes high VDRIVE goes high at about time 05 before a voltage droop on VCCI is apparent. This action is in contrast to the prior art shown in FIG. 6, where VDRIVE could not respond until after VCCI began to droop.

As VDCPRE and VHYST+ fall just after time 15, VHYST− goes high to turn on transistor 303 shown in FIG. 3. Again, the VHYST− timing is selected to anticipate the voltage overshoot condition that occurs when the high current load is turned off. In response to VHYST− going high and VTRIM rising to a voltage just below VREF, VDRIVE falls just before time 20 thereby turning off driver 103. As a result, the VCCI waveform is markedly flatter and consistently near to the target VCCI specification throughout the high load current switching event using the method and apparatus in accordance with the present invention.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A voltage down converter comprising:
    an input node receiving an external voltage VEXT;
    a driver unit selectively coupling the input node to an internal voltage supply node in response to a drive control signal;
    a reference voltage generator providing a voltage VREF;
    a hysteresis timing unit responsive to a first control signal and generating one or more control signals selected from the group consisting of a second control signal VHYST− and a third control signal VHYST+; and
    a comparator unit coupled to the internal voltage supply node, VREF, VHYST− and VHYST+ and coupled to the driver unit to generate the drive control signal, the comparator unit shifting a trip point of the comparator in response to the second and third control signals.

2. The voltage down converter of claim 1 wherein the comparator unit further comprises:
    a differential input stage having a first input coupled to a signal that is proportional to the voltage on the internal voltage supply node, a second input coupled to VHYST−, a third input coupled to VREF, and a fourth input coupled to VHYST+, and an output, wherein the input stage generates the drive control signal.

3. The voltage down converter of claim 2 wherein the differential input stage comprises:
    a first branch within the differential input stage comprising a first load device, a primary current path providing a current through the first load device that is proportional to the voltage on the internal voltage supply node, and supplementary current path providing a current through the first load device when the VHYST− signal is active; and
    a second branch within the differential input stage comprising a second load device, a primary current path providing a current through the second load device that is responsive to the reference voltage, and supplementary current path providing a current through the second load device when the VHYST+ signal is active.

4. The voltage down converter of claim 3 wherein the primary current path of the first branch comprises a first field effect transistor coupled in series with the first load device having a gate electrode coupled to a signal that is proportional to the voltage on the internal voltage supply node; and wherein the supplementary current path of the first branch comprises a second and a third field effect transistor coupled in series with each other and with the first load device, wherein the gate of the second field effect transistor is coupled to the VHYST− signal and the gate of the third field effect transistor is coupled to the reference voltage generator.

5. The voltage down converter of claim 3 wherein the primary current path of the second branch comprises a first field effect transistor coupled in series with the second load device having a gate electrode coupled to the reference voltage generator; and wherein the supplementary branch of the second current path comprises a second and a third field effect transistor coupled in series with each other and with the second load device, wherein the gate of the second field effect transistor is coupled to the VHYST+ signal and the gate of the third field effect transistor is coupled to the reference voltage generator.

6. The voltage down converter of claim 1 wherein the hysteresis timing unit further comprises:

a first input coupled to the drive control signal;

a second input coupled to receive a clock signal, wherein the clock signal is selected to anticipate activation and deactivation of a high current load coupled to the internal voltage supply node; and a logic circuit for combining signals on the first and second inputs to generate the first control signal VHYST−.

7. The voltage down converter of claim 6 wherein the hysteresis timing unit further comprises:

a voltage shift circuit coupled to the second input to shift the signal on the second input from a logic level based on the internal supply voltage to a logic level compatible with the external voltage.

8. A method for converting voltage VCC supplied to a pin of an integrated circuit to a lower internal voltage VCCI on an internal voltage supply node, the method comprising the steps of:

generating a first signal proportional to the internal voltage;

coupling the first signal to a comparator, the comparator operating to generate a second signal indicating when the first signal is above or below the trip point;

monitoring a clock signal to anticipate current load in the integrated circuit; and shifting the trip point in response to the clock signal.

* * * * *